United States Patent [19]

Amann et al.

[11] 4,453,227

[45] Jun. 5, 1984

[54] METHOD AND APPARATUS FOR TRANSFERRING A BIT PATTERN FIELD INTO A MEMORY

[75] Inventors: Hugo Amann, Karlsruhe; Dieter Funke, Waldbronn, both of Fed. Rep. of Germany

[73] Assignee: Siemens Aktiengesellschaft, Munich, Fed. Rep. of Germany

[21] Appl. No.: 258,010

[22] Filed: Apr. 27, 1981

[30] Foreign Application Priority Data

Apr. 30, 1980 [DE] Fed. Rep. of Germany ....... 3016738

[51] Int. Cl.³ .................................................. G06F 3/00
[52] U.S. Cl. .................................... 364/900; 364/200; 358/260; 358/261
[58] Field of Search ... 364/200 MS File, 900 MS File; 358/261, 260

[56] References Cited

U.S. PATENT DOCUMENTS

| | | | |
|---|---|---|---|
| 3,801,737 | 4/1974 | Komura et al. | 358/260 |
| 3,916,095 | 10/1975 | Weber et al. | 358/261 |
| 4,003,031 | 1/1977 | Kashio | 364/900 |
| 4,069,511 | 1/1978 | Lelke | 364/200 |
| 4,078,249 | 3/1978 | Lelke et al. | 364/200 |
| 4,100,580 | 7/1978 | Hendrikus | 358/261 |
| 4,115,815 | 9/1978 | Nakagome et al. | 358/261 |
| 4,117,517 | 9/1978 | Shintani et al. | 358/261 |
| 4,136,363 | 1/1979 | Saran | 358/261 |
| 4,141,068 | 2/1979 | Mager et al. | 364/200 |
| 4,152,697 | 5/1979 | Rider et al. | 358/261 |
| 4,156,880 | 5/1979 | Yamada | 358/261 |
| 4,191,956 | 3/1980 | Groothuis | 364/900 |
| 4,259,719 | 3/1981 | Edelman et al. | 364/200 |

Primary Examiner—Joseph F. Ruggiero
Assistant Examiner—Jameson Lee
Attorney, Agent, or Firm—Kenyon & Kenyon

[57] ABSTRACT

In order to keep the number of data transfers small in storing bit pattern fields in an external memory, only the first line and the changed data of the bit pattern field are transmitted and the field is reconstructed line by line by means of an interim register and then stored. For this purpose the interim register has, besides a data input connected with the bit pattern field and an input for a STROBE signal, an input for addressing register locations corresponding to those memory building blocks, the data of which has changed from line to line. Advantageously, groups of eight memory building blocks, to which an interim register in the form of an 8-bit decoder register is assigned, are used.

2 Claims, 2 Drawing Figures

METHOD AND APPARATUS FOR TRANSFERRING A BIT PATTERN FIELD INTO A MEMORY

BACKGROUND OF THE INVENTION

This invention relates to data transmission in general and more particularly to the fast transfer of bit pattern fields.

In data processing, the problem of evaluating bit pattern fields, to write them into a memory or to call them up from a memory, sometimes arises. Such bit pattern fields are a sequence of binary numbers in which the binary numerals are not considered or used as binary numbers in a fixed format but in which other meanings are assigned to the individual bits, for instance, a switching state (yes/no). Such bit pattern fields, in which the binary numbers are ordered in columns and rows, are found, for instance, in digital testing or in electronic picture analysis and image recognition. In such cases a large volume of data is not uncommon. Such bit pattern fields must be stored, for instance, in an external memory. For this purpose, the external memory is organized in columns and lines, i.e., there are p memory building blocks with a storage depth of z bits, forming z lines, so that each memory building block can be assigned to an output terminal of the test system.

In many bit pattern fields, only a few bits generally change from line to line, i.e., the essential information of the bit pattern field is obtained from changes which occur from line to line. Thus, it is sometimes also customary to characterize bit pattern fields in the form of changes. Sometimes the source data of determined facts are also already given in change form.

In the transmission of data it is otherwise also necessary to control the flow of data by special accompanying signals. Thus, the data lines are provided, for instance, with multi-digit addresses; for determining the switching state of the register, a clock signal, the so-called STROBE signal is used; and as control signal for memory building blocks, the WE signal (meaning "write" or "read") is customary.

SUMMARY OF THE INVENTION

Starting from a method for the transmission of a bit pattern field consisting of p columns and z lines, it is an object of the present invention to describe process steps which permit reducing the burden on the data channel used for the transmission, in time, of the bit pattern field, by allowing the transmission of a reduced amount of data but which, nevertheless, ensure a correct reproduction of the entire bit pattern field.

For solving this problem, according to the present invention, only the data bits which have changed from a preceding line are transmitted; the changed bits are identified by their column address and the bits not transmitted, the state of which has not changed from the preceding line, are duplicated in an interim register by storing the previous state.

If such a method is used, the number of data transfers can be kept small, i.e., the operating speed of a data processor can be increased and the possible loading of the system can be improved.

A preferred circuit arrangement for carrying out the method, including a memory comprising several memory building blocks, the number of which corresponds to the number of columns of the bit pattern field and the memory depth of which corresponds to the number of lines of the bit pattern field, has the memory preceded by an interim register with a width of p bits. The interim register, besides a changed data input and an input for a STROBE signal, has an input for addressing those bit locations corresponding to the memory building blocks, the data of which changes from line to line. Furthermore, the data inputs of the individual memory building blocks are connected to the output of the interim register. Each memory building block has a second input for a WE signal and a number of further inputs for a multi-digit line address signal, where all inputs for the WE signal on the one hand and all inputs for the line address signal on the other hand are connected in parallel.

In implementing the method with this circuit arrangement, the starting bit pattern, i.e., the first line of the bit pattern field, is first set into the interim register at the end of the data channel. Due to a write command, the register content is transferred simultaneously to all memory building blocks. Subsequently the second line of the bit pattern field can be processed by setting only the changing bits into the corresponding cells of the interim register, which otherwise remains unchanged. Thereupon the transfer of the register content into the following memory locations of the memory building blocks again takes place by a control command. This sequence can be repeated as often as desired as long as empty memory locations of the memory building block are still available.

A particularly simple circuit arrangement is obtained if the memory building blocks are combined in groups of eight each. In this case, an 8-bit decoder register can be used as the interim register for duplicating the redundant bits. The data bit is accompanied here by column address information which consists of a group address signal and the binary selection address of the respective memory building block of the group of eight. In connection with a STROBE signal, the group address signal activates the interim register, and the data is stored at the location designated by the address of the memory building block. When all changes have been entered, a WE signal causes the register information, under the respective line address, to be fed to the memory building block.

DETAILED DESCRIPTION

Figures 1, 2:
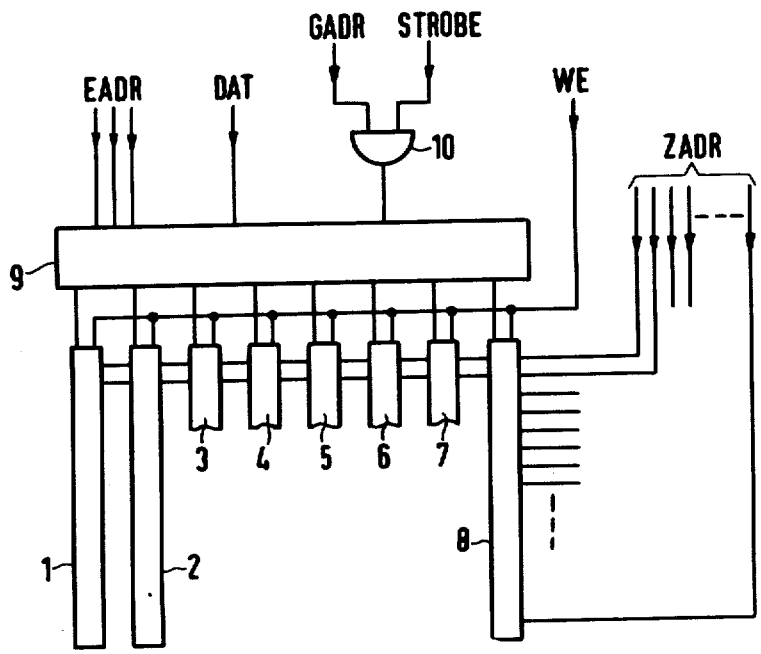
FIG. 1 shows a bit pattern field which is to be stored in an external memory.
FIG. 2 is a block diagram of an embodiment of the circuit arrangement of the present invention.

The bit pattern field according to FIG. 1 consists of p columns and z lines. For transferring this bit pattern field into a memory, a memory building block with a memory depth of z bits is assigned to each column of the bit pattern field. The bit pattern field consists of the numbers 1 and 0, where only a small number of changes of the binary numerals is present from line to line within the field. These changes are emphasized by heavier lines, for instance, in the fourth row, the bits of columns 4 and 11.

This bit pattern field can be transferred into a memory substantially faster if, except for the first line, only the bits changing from line to line, together with an identification of the position of these bits within the bit pattern field, are transmitted. In this case it is not necessary however to restore the respective line of the bit pattern field before the transmitted data are stored, so that in each memory building block the information coming to it can be stored. A circuit arrangement for this purpose is shown in FIG. 2, where it is assumed that the memory building blocks are combined in groups of eight.

The eight memory building blocks 1 to 8 of a memory are preceded by the interim register 9 with a width of 8 bits. This interim register is a standard decoder register which allows the transfer of a data bit into one of eight memory cells selected by a binary coded input address. The individual outputs of the interim register are connected to the inputs of the memory building blocks 1 to 8. The interim register has, besides a data input DAT and a STROBE input for a clock signal, three further inputs EADR 0 ... 2 for addressing the eight locations corresponding to the individual memory building blocks.

For transferring the bit pattern field shown in FIG. 1 into the memory, several circuit arrangements as per FIG. 2 are basically required, so that columns of the bit pattern field going beyond the number 8 can also be stored. These further circuit arrangements are not show, however. In order to indicate, in the transmission and storage of the data, to which group of columns of the bit pattern field and therefore, to which group of memory building blocks the individual data should be assigned, the respective data information is accompanied by a group address GADR present in 1-of-n code. Only if the group address signal applicable to the respective group is present, can the respective interim register be activated, due to the logic element 10, e.g., and And gate.

In transferring the bit pattern field shown in FIG. 1 into the memory, the bit pattern of line 1 of the bit pattern field is first entered bit by bit into the interim register via the data channel DAT. Upon a write command WE which reaches all memory building blocks 1 to p simultaneously, the register content is transferred simultaneously to all memory building bocks. Subsequently, line 2 of the bit pattern field is processed in the interim register 9 under control of the element address EADR, transmitting only the bits of the bit pattern field which change from line 1 to line 2 and loading these bits into the corresponding bit pattern cells. If the group address signal present is proper the register state is updated on occurence of the STROBE signal and subsequently the line stored in the interim register is transferred by the write signal WE into the next memory location of the memory building blocks 1 to 8. The respective memory location in the memory building blocks is determined by the multi-digit line address ZADR, which is transmitted in common for all memory building blocks.

What is claimed is:

1. A circuit arrangement for transferring and storing a bit pattern field consisting of p columns and z lines comprising:

(a) a memory including p memory building blocks, each having a data input, an input for a write signal and a plurality of inputs for a multidigit line address signal, each memory building block having a memory depth of z lines;
   (b) an interim register with p register positions, each capable of storing a bit, preceding said memory, said interim register having a data input, an input for a strobe signal, an input for addressing the p register positions and p data outputs, the data inputs of the p individual memory building blocks connected to the p data outputs of the interim register;
   (c) a write line for coupling a write signal to the write signal input of all of said memory building blocks simultaneously, for each line of said bit pattern field; and
   (d) an address bus for carrying a multidigit line address signal, for each line of said bit pattern field coupled in parallel to the inputs for a multidigit line address signal of all of said memory building blocks, whereby, the bits of said first line of said bit pattern field can be transferred to said interim register serially with each register position addressed in sequence and thereafter transferred to said memory building blocks by addressing the first of the z positions therein while at the same time providing said write signal whereafter, for each succeeding line of said bit pattern field only those bits different from a respectively corresponding bit of the content of said interim register occupying the same relative column position are transmitted to respective positions in said interim register occupied by said respectively corresponding bits in the interim register, the remaining bits in said interim register which are not different from a respectively corresponding bit of the current line of bit pattern field for transmission remaining stored in said interim register unchanged whereby further transfers from the interim register to the second and each succeeding line of said memory will take place using a respective said multidigit line address signal and a respective said write signal in a synchronized manner with respect to the formation of respective bit pattern lines in the interim register such that each line of the bit pattern field will successively be transferred to a corresponding line in said memory.

2. A circuit arrangement according to claim 1 wherein said bit pattern field has more than eight columns, and wherein memory building blocks are combined in groups of eight, an interim register in the form of an 8-bit decoder register being coupled to each group of 8 memory building blocks, and further including logic means associated with each interim register having an output coupled to a STROBE input of the respectively associated interim register, and inputs for coupling to a STROBE signal and a group address signal for selective input to the respectively associated interim register.

* * * * *